United States Patent [19]

Dhillon

[11] 4,446,218

[45] May 1, 1984

[54] SULFUR AND/OR AMIDE-CONTAINING EXPOSURE ACCELERATORS FOR LIGHT-SENSITIVE COATINGS WITH DIAZONIUM COMPOUNDS

[75] Inventor: Major S. Dhillon, Hillsborough, N.J.

[73] Assignee: American Hoechst Corporation, Somerville, N.J.

[21] Appl. No.: 359,629

[22] Filed: Mar. 18, 1982

[51] Int. Cl.³ .................... G03C 1/58; G03C 1/60; G03C 1/54
[52] U.S. Cl. .................... 430/175; 430/145; 430/157; 430/177; 430/178; 430/179; 430/180; 430/181; 430/182; 430/292; 430/294; 430/300; 430/302
[58] Field of Search ............ 430/175, 145, 157, 177, 430/179, 180, 181, 182, 151, 152, 292, 294

[56] References Cited

U.S. PATENT DOCUMENTS

| | | |
|---|---|---|
| 2,063,631 | 12/1936 | Schmidt et al. . |
| 2,667,415 | 1/1954 | Neugebauer et al. . |
| 2,871,119 | 1/1959 | Weegar et al. .............. 430/175 |
| 2,893,866 | 7/1959 | Haefeli et al. . |
| 3,312,705 | 4/1967 | Sus et al. . |
| 3,367,776 | 2/1968 | Bialczak et al. . |
| 3,623,875 | 11/1971 | Desjarlais . |
| 3,679,419 | 7/1972 | Gillich . |
| 3,785,826 | 1/1974 | Slimowicz et al. .............. 430/180 |
| 3,849,392 | 11/1974 | Steppan . |
| 3,867,147 | 2/1975 | Teuscher . |
| 3,960,684 | 6/1976 | Feinberg .............. 430/176 |

OTHER PUBLICATIONS

Kosar, J., "Light-Sensitive Systems", J. Wiley & Sons, 1965, pp. 194, 220, 225, 231, 237 and 243.

Primary Examiner—Charles L. Bowers, Jr.
Attorney, Agent, or Firm—Richard S. Roberts; James C. Lydon; Kenneth P. Glynn

[57] ABSTRACT

This invention relates to proof film-type light sensitive diazonium materials containing accelerators selected from sulfur and/or amide-containing compounds which are capable of accelerating the contact exposure of negative-working diazonium compounds when such diazonium compounds are subjected to UV radiation. These accelerators enhance essentially photosensitivity speed. The invention also relates to presensitized reproduction materials comprising diazonium materials containing these accelerators.

16 Claims, No Drawings

SULFUR AND/OR AMIDE-CONTAINING EXPOSURE ACCELERATORS FOR LIGHT-SENSITIVE COATINGS WITH DIAZONIUM COMPOUNDS

BACKGROUND OF THE INVENTION

The present invention relates to accelerators for light sensitive diazonium compounds and to presensitized reproduction materials such as proofing films, contact films and other nonprinting films, having enhanced photosensitivity and increased speed.

Pre-sensitized reproduction materials such as these used for contact exposure processes generally comprise a film base over which is applied a photosensitive coating composition. The film base may be a flexible sheet such as paper, plastic, metal-coated plastic or a combination of plastic and paper. Plastics used for such purposes may consist of polyester, polystyrene, polypropylene, cellulose acetate, and the like. The film used may optionally have applied a coating of an adhesion promoter which will provide improved anchorage for the subsequently applied light sensitive coating. Most commonly used adhesion promoters are, but not restricted to, silane and siloxane compounds and are well known in the art.

Diazonium compounds most commonly employed in the preparation of light sensitive compositions suitable for proofing film, contact film applications or photoresist applications may be characterized by the generic structure $A-N_2^+X^-$, wherein A is an aromatic or heterocyclic residue and X is the anion of an acid.

Specific examples of light sensitive diazonium materials useful as aforementioned include higher molecular weight compositions obtained, for example, by the condensation of certain aromatic diazonium salts in an acid condensation medium with active carbonyl compounds such as formaldehyde, as disclosed for example in U.S. Pat. Nos. 2,063,631 and 2,667,415.

More recently, improved diazonium materials within the above generic formula have been developed which are faster, more adherable to support materials and exhibit lessened sensitivity to moisture. These include the reaction products having the structures resulting from the condensation of the compounds of Formula I, as follows:

FORMULA I: At least one diazonium salt having the structure:

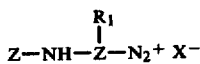

wherein Z is the benzene ring;
wherein X is as defined above; and,
wherein $R_1$ is selected from the group consisting of H, an alkoxy group having from 1 to 4 carbon atoms, and a 2-hydroxy-ethoxy group, condensed with at least one compound of the general structure:

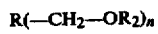

wherein n is an integer from 1 to 4;
wherein R is a residue produced by the splitting off of n hydrogen atoms from a diphenyl ether; and,
wherein $R_2$ is an alkyl group with 1 to 4 carbon atoms,
said condensation product containing, on the average, about 0.25 to about 0.75 units derived from $R(-CH_2-OR_2)_n$ per units of diazo group. Such materials are disclosed in U.S. Pat. No. 3,679,419, incorporated herein by reference.

Other diazonium compounds include the polycondensation products having the structures resulting from the condensation of the compounds of Formula II, as follows:

FORMULA II: At least one $A-N_2^{+X-}$ compound as discussed above, condensed with at least one compound of the structure

as defined on column 1, lines 15–72 and column 2, lines 1–5 of U.S. Pat. No. 3,849,392, incorporated herein by reference.

The referenced patent relates to a process for the preparation of polycondensation products of aromatic diazonium compounds, useful as light-sensitive coatings, particularly in the preparation of printing plates and the like, in which at least one $A-N_2X$ compound and at least one $B_1$ compound of the formula:

in which: $A-N_2X$ is a radical of a compound selected from the group consisting of a compound of the formulae:

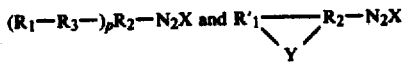

wherein
$R_1$ is an aryl group of the benzene or naphthalene series
$R_1'$ is an arylene group of the benzene or naphthalene series
$R_2$ is a phenylene group
$R_3$ is a single bond or one of the groups

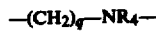

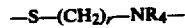

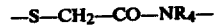

or

the left-hand free valence of the specified groups is attached to $R_1$ and the right-hand free valence is attached to $R_2$,
wherein
q is a number from 0 to 5
r is a number from 2 to 5

$R_4$ is selected from the group consisting of hydrogen, alkyl with 1 to 5 carbon atoms, aralkyl with 7 to 12 carbon atoms, and aryl with 6 to 12 carbon atoms, $R_5$ is an arylene group having 6 to 12 carbon atoms $R_5$ is an arylene group having 6 to 12 carbon atoms Y is one of the groups —NH—, and —O—

X is an anion

P is a number from 1 to 3

E is a residue obtain by splitting of mH atoms from a compound free of diazonium groups selected from the group consisting of aromatic amines, phenols, thiophenols, phenol ethers, aromatic thioethers, aromatic heterocyclic compounds, aromatic hydrocarbons and organic acid amides, $R_a$ is selected from the group consisting of hydrogen and phenyl, $R_b$ is selected from the group consisting of hydrogen and alkyl and acyl groups having 1 to 4 carbon atoms, and a phenyl group, and m is an integer from 1 to 10, are reacted in a strongly acid condensation medium and under condensation conditions sufficient to produce a polycondensation product of an aromatic diazonium compound containing on the average, about 0.1 to 50 $B_1$ units per unit of $A-N_2X$.

Still other diazonium materials include those materials having repeating units of the structures resulting from the condensation of the compounds of Formula III, as follows:

FORMULA III: At least one $A-N_2^+X^-$ compound as discussed above, condensed with at least one compound of the structure B, as defined on column 93, lines 65-70 and column 94, lines 1-58 of U.S. Pat. No. 3,867,147, incorporated herein by reference.

The referenced patent describes an aromatic diazonium compound comprising repeating units of each of the general types $A-N_2X$ and B which are linked by methylene groups, in which $A-N_2X$ is a radical of a compound of one of the general formulae

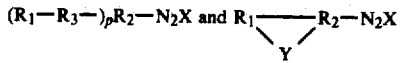

wherein $R_1$ is an arylene group of the benzene or naphthalene series $R_2$ is a phenylene group $R_3$ is a single bond or one of the groups —$(CH_2)_q$—$NR_4$—

—O—$(CH_2)_r$—$NR_4$—

—S—$(CH_2)_r$—$NR_4$—

—S—$CH_2$—CO—$NR_4$—

—O—$R_5$—O—

—O—

—S— or

—CO—$NR_4$— the left-hand free valence of the specified groups is attached to $R_1$ and the right-hand free valence is attached to $R_2$, wherein q is a number from 0 to 5 r is a number from 2 to 5

$R_4$ is selected from the group consisting of hydrogen, alkyl with 1 to 5 carbon atoms, aralkyl with 7 to 12 carbon atoms, and aryl with 6 to 12 atoms, $R_5$ is an arylene group having 6 to 12 carbon atoms —Y— is one of the groups —NH—, and —O—

X is an anion of the diazonium compound, and

P is a number from 1 to 3, and

B is a radical of a compound selected from the group consisting of aromatic amines, phenols, thiophenols, phenol ethers, aromatic thioethers, aromatic heterocyclic compounds, aromatic hydrocarbons and organic acid amides, in which the aromatic nuclei are unsubstituted or substituted by at least one substituent activating condensation and selected from the group consisting of —$NR_7R_8$, —$N(R_8)_2$, —$OR_7$, —$OR_8$, —$R_8$, and —$SR_8$, wherein $R_7$ is —H, —CO—alkyl, —CO—aryl, —$SO_2$—alkyl, —$SO_2$—aryl, —$CONH_2$, or $CSNH_2$, and $R_8$ —H, alkyl, aryl or aralkyl, the alkyl groups having 1 to 10, the aryl groups 6 to 20, and the aralkyl groups 7 to 20 carbon atoms, which diazonium compound contains, on the average, about 0.01 to 50 B units per units of $A-N_2X$.

Yet another category of extremely fast light sensitive diazos are those disclosed in copending application Ser. No. 359,335, filed in the United States Patent Office of even date herewith, which is a continuation-in-part of Ser. No. 06/245,837, filed in the United States Patent Office on Mar. 20, 1981, by John E. Walls, entitled "Reproduction Materials Based on Light Sensitive Diazo Compounds", both incorporated herein by reference.

These materials may be characterized as the condensation products of the compounds of Formula IV, as follows:

FORMULA IV: The condensation product of oligomers having the structure:

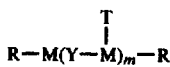

wherein:

R is selected from the group consisting of

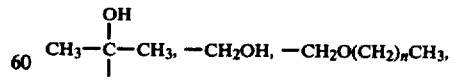

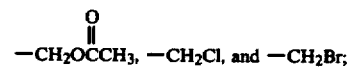

n is an integer from 0 to 3;

M is an aromatic radical of one or more compounds selected from the group consisting of aromatic hydrocarbons, diaryl ethers, diaryl sulfides, diaryl amines, diaryl sulfones, diaryl ketones and diaryl diketones;

m is 1 to about 9;

Y is selected from the group consisting of —CH$_2$— and —CH$_2$OCH$_2$—; and,

T is the same as R when Y is —CH$_2$— and is hydrogen when Y is —CH$_2$—O—CH$_2$—, condensed with diazonium salts having the structure:

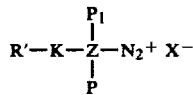

wherein:

Z is the benzene ring;

R' is selected from the group consisting of phenyl and C-1 to C-4 alkyl substituted phenyl;

K is selected from the group consisting of

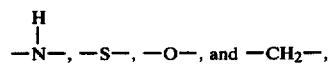

or is absent;

P and P$_1$ may be the same or different and are selected from the group consisting of C$_1$ to C$_4$ alkyl, methoxy, ethoxy, butoxy, and H; and, X is an anion.

Whereas recently developed, faster diazos offer many advantages in terms of speed and quality which render them extremely suitable in applications requiring low energy light exposure, including laser exposure applications, the demand, nonetheless, for even higher speed compositions persists. Although many of the less sensitive low molecular weight diazos exhibit acceptable speeds and photosensitivity for many applications, sensitized proofing films and the like coated with the accelerated compositions of the present invention offer even faster, more efficient and more profitable production capabilities.

PRIOR ART STATEMENT

Accelerators have also been employed in two component light sensitive diazotype photographic compositions. These compositions are used in photographic processes where dyes are formed in-situ as the result of a coupling reaction between an undecomposed diazonium salt and a coupling component. The object of acceleration in these systems is to accelerate coupling of the diazonium salt and coupler upon exposure to light. While the chemistry in such systems differs from the planographic systems disclosed herein, some accelerators similar to those employed in planographic systems have been suggested by the prior art.

U.S. Pat. No. 3,623,875 to Robert Charles Desjarlais teaches that aromatic sulfinic acid may be included in negative working diazosulfonate reproduction systems to prevent background coloration, and U.S. Pat. No. 3,367,776 to Edward C. Bislczak et al teaches the use of aminoalkyl amide of 2-hydroxy-3-naphthoic acid as a stabilizing agent for similar systems. U.S. Pat. No. 3,312,705 describes the use of 2-hydroxy-3-naphthoic acid-N-methyl piperazide and analogous compounds as coupling components in photosensitive coatings. The coupling components serve to give a color change upon development with ammonia vapors after exposure to actinic radiation. U.S. Pat. No. 2,893,866 describes the use of 2,3-hydroxynaphthoic acid-orthoanisidide and analogous compounds as coupling components for diazonium compounds. The coupling components are dissolved in developer solutions rather than in photosensitive coatings. However, unlike the present invention, these prior art references involve the use of couplers with a different chemistry and in which these additives function as coloration preventatives, stabilizers, and as coupling components respectively, and not as an accelerator for proof film-type light sensitive diazonium compounds.

Accordingly, it is believed that the present invention will provide proof film-type light sensitive diazonium compositions having enhanced speed and photosensitivity, as well as light sensitive diazonium based photoresist materials and printing plates having enhanced speed and photosensitivity.

SUMMARY OF THE INVENTION

The present invention is directed to the provision of proofing film-type light sensitive diazonium compositions containing accelerating amounts of one or more selected sulfur and/or amide-containing compounds of the type hereinafter defined.

DETAILED DESCRIPTION OF THE INVENTION

Diazonium compounds subject to acceleration in accordance with the present invention include those materials falling within the scope of the formula A—N$_2$+X— set forth above, including the specific compositions resulting from condensation reactions in accordance with Formulas I–IV illustrated above. Specific materials include, but are not limited to, the product of condensation of p-diazo diphenyl amine sulfate and paraformaldehyde in sulfuric acid, isolated as the hexafluorophosphate salt, also known as "Diazo BBP", sold by the MRI Corporation, Heightstown, N.J.; the product of the condensation of 3-methoxy-diphenylamine-4-diazonium sulfate and 4,4'-bis-methoxy-methyldiphenylether in phosphoric acid, isolated as the naphthalene-2-sulfonic acid salt, as disclosed in U.S. Pat.No. 3,679,419; the product of the condensation of p-diazo diphenyl amine sulfate and paraformaldehyde in phosphoric acid, isolated as the hexafluorophosphate salt; and the reaction product of a homocondensed oligomer such as based on a 4,4'-bis-alkoxy diphenyl ether condensed with a 3-alkoxy-4-diazo diphenyl amine sulfate in phosphoric acid, isolated as the mesitylene sulfonate salt.

Diazonium compounds which are most advantageously accelerated in accordance with the teachings of the present invention are those extremely light sensitive materials exhibiting an absorbtivity of 45% or less when scanned in the range of 350 to 390 nanometers using a Perkin-Elmer UV visible spectrometer (Model No. 559) under standard test conditions. The diazonium compound is evaluated as a 1×10$^{-3}$% by weight solution in Methyl Cellosolve TM (a Union Carbide product, 2-methoxy ethanol) in a cuvette, blanked out against Methyl Cellosolve TM , at a slit of one nanometer and a range of 0–1. The accelerators of the present invention serve to enhance the speed of reaction of the diazonium compounds, without a series sacrifice to the stability or image quality.

The accelerators within the scope of the present invention are sulfur and/or amide-containing compounds. More specifically, the accelerators of the present invention are selected from the group consisting of 1,1-thiobis(2-naphthol), diresorcinol sulfide; diphenyl sulfone; phenathiazine; dibenzothiophene sulfone; N(3-hydroxyphenyl)-2-hydroxy-3-naphthamide; 2,3-hydroxy naphthoic acid ethanolamide; N,N'-ethylene-bis-aceto acetamide; 4-bromo, 3,5-resorcylic acid amide and the sulfur compounds, and amide compounds which are functional equivalents thereof. By "functional equivalents" is meant any such compound which does not have any substantial negative affect on the coating solution and which has not been identified at the time of filing of this application, but which may subsequently be found by those skilled in the art to give results in terms of diazonium speed comparable to the favorable results provided by the specifically stated compounds. In general, such compounds which impart at least a 40% increase in the speed under the test conditions set forth herein, are included in this invention.

The relative proportions of diazonium compound and accelerator required to provide effective acceleration will vary depending upon the identity of the diazonium compound and the particular accelerator. In general, from about 0.005 to about 1.5 parts by weight of accelerator per part by weight of the diazonium compound will prove satisfactory. However, greater than 1.5 parts by weight of accelerator does not hurt but also does not provide any additional significant advantage in speed of the film. The accelerated light sensitive diazonium compositions of this invention may be used in reproduction layers in the conventional way. They may be dissolved in the appropriate solvent in which they are soluble, e.g., water or organic solvents, and coated on supports and dried to form proofing films, color proofing foils, resists for printed circuitry and the like. Such supports include transparent plastic sheets, paper, copper and the like.

The layer compositions may also include other additives known in the art such as pigments, dyes, polymer binders, plasticizers, sensitizers, wetting agents, indicators, stabilizers and the like. Representative conventional additives and polymer binders are set forth in more detail in U.S. Pat. No. 3,679,419.

All additives should be selected such that they are compatible with the diazonium compound, the accelerator and polymeric binder, if any, employed in the formulation of the light sensitive layers, as well as the solvent employed in preparing the layer. Suitable solvents include water, lower aliphatic alcohols and ethers, and aromatic and aliphatic hydrocarbons. Suitable polymer binders include materials soluble in water or basic aqueous systems such as polyvinyl alcohol, polyacrylamides, copolymers of vinyl aromatic compounds with acidic comonomers such as maleic anhydride. Water insoluble binders such as phenol and alkyd resins and acrylic polymers may also be used. Polymeric binders where employed, are generally used at a level of from about 1 to 50 parts by weight per part by weight of diazonium compound.

The accelerated diazonium compositions of the present invention are most efficiently prepared by forming a solution of the diazonium compound and the accelerator in a solvent in which both materials are soluble. The solution may also include other additives dissolved or dispersed therein. The solution may be applied to the appropriate substrate by any known technique such as swabbing, whirl coating or simple wipe-on, followed by drying to drive off the solvent.

The following Examples are illustrative of the invention.

CONTROL A

A transparent polyester film base, sold by American Hoechst Corporation of Somerville, N.J., under the trademark of Hostaphan, (18"×18") was whirl coated with the following photosensitive coating solution:

| Ingredient | % (W/W) |
|---|---|
| 1. 2-methoxy ethanol | 26.368 |
| 2. Methyl ethyl ketone | 34.430 |
| 3. Ethanol (anhydrous) | 25.550 |
| 4. Dimethyl phthalate | 0.480 |
| 5. p-toluene sulfonic acid | 0.350 |
| 6. Styrene-Maleic Anhydride (50/50) Binder Resin | 1.910 |
| 7. Synthetic gum (hydroxy isopropyl cellulose) | 0.012 |
| 8. Calcozine Yellow dye | 1.640 |
| 9. Rhodamine 6 GDN Red dye | 0.660 |
| 10. Victoria Blue FGA Blue dye | 0.600 |
| 11. Diazo | 8.000 |

The diazo is one containing the product of the condensation of p-diazo diphenylamine sulfate and paraformaldehyde, isolated as the hexafluorophosphate salt. The solution contained 8.0 grams of diazonium compound per 100 grams of solution as shown. The film was baked at 100° C. for two minutes to drive off the residual solvents from the coated film.

The coated film was cut into a plurality of 10×5" pieces and a piece was exposed with mercury vapor light source using a test flat having a 21 step Stouffer step wedge (emulsion to emulsion), with each increasing step representing a change in density equal to the square root of 2. The vacuum frame was equipped with a light integrator for precise and automatic shutter control. Exposure was made in units (1 unit equals approximately 10 millijoules per centimeter$^2$) and each test film was exposed with 4 units of light at a fixed time exposure. The exposed film sample was then developed with an aqueous alkaline developer containing metal salts of phosphoric and salicic acid. After development, the control film was found to have a clean background areas. The step wedge of this control film was found to have no solid and 1 ghost step.

CONTROL B

The Control A was repeated in all aspects, except that in this case the diazonium compound employed was the product of the condensation of 4,4'-bis-methoxy-methyl diphenyl ether with 3-methoxy 4-diazo diphenylamine sulfate isolated as mesitylene sulfonate salt. This diazonium compound and analogous diazonium compounds are disclosed in U.S. Pat. No. 3,849,392.

The coated film was processed in the same manner as described in Control A and was found to have 1 solid and 2 ghost steps.

CONTROL C

The Control A was repeated in all aspects, except that in this case the diazonium compound used was the reaction product of the homo condensation product of 4,4'-bis methoxy methyl diphenyl ether with 3-methoxy-4-diazo diphenylamine sulfate, isolated as the mesitylene sulfonate salt. This diazonium compound and analogous diazouium compounds are disclosed in co-pending U.S. patent application Ser. No. 06/245,837, filed on Mar. 20, 1981, by John E. Walls, entitled "Reproduction Materials Based on Light Sensitive Diazo Compounds", incorporated herein by reference.

The coated film on processing in the same way as used for Control A was found to have 2 solid and 2 ghost steps.

EXAMPLE 1

0.5 gram of 1,1-thiobis(2-naphthol) was added to 99.5 grams of Control A coating solution. The solution was made by agitation at room temperature (68° F.) for 20 minutes. The filtered solution was whirl coated onto polyester film support. The coated film was exposed and developed as described in Control A. The processed film gave 1 solid and 2 ghost steps.

EXAMPLE 2

0.4 gram of 1,1-thiobis(2-naphthol) was dissolved in 99.6 grams of Control B coating solution. A polyester film support was whirl coated with the filtered solution. The coated film was processed according to the method of Control A. 2 solid and 3 ghost steps were obtained.

EXAMPLE 3

0.6 gram of diresorcinol sulfide was dissolved in 99.4 grams of Control C coating solution. The filtered solution was whirl coated onto a polyester film support. The coated film upon processing according to the method of Control A gave 2 solid and 4 ghost steps.

EXAMPLE 4

0.5 gram of 2-mercaptobenzothiazole was added to 99.5 grams of Control A coating solution. The solution was made by agitation at room temperature for 30 minutes. A whirl coated polyester film support upon processing according to the method of Control A gave no solid and 3 ghost steps.

EXAMPLE 5

0.75 gram of diphenyl sulfone was dissolved in 99.25 grams of Control B coating solution. A polyester film support was whirl coated with the filtered solution. The coated film upon processing according to the method of Control A gave 1 solid and 3 ghost steps.

EXAMPLE 6

0.3 gram of phenothiazine was added to 99.7 grams of Control C coating solution. The solution was made by agitation at room temperature and filtered. A polyester film support was whirl coated with this solution. The coated film was processed according to the method described in Control A. 2 solid and 4 ghost steps were obtained.

EXAMPLE 7

0.5 gram of dibenzothiophene sulfone was dissolved in 99.5 grams of Control B coating solution. The filtered solution was whirl coated onto a polyester film support. The coated film was processed according to the method of Control A. 1 solid and 3 ghost steps were obtained.

EXAMPLE 8

0.5 gram of 2-benzoxazolethiol was dissolved in 99.5 grams of Control B coating solution. A polyester film support was coated with the filtered solution. The coated film was processed according to the method of Control A. 1 solid and 3 ghost steps were obtained.

EXAMPLE 9

| Control C coating solution | 99.6 grams |
| 3,5-resorcyclic acid ethanol amide | 0.4 gram |

3,5-resorcyclic acid ethanol amide was dissolved in the solution by agitation at room temperature for 20 minutes. The filtered solution was whirl coated onto a polyester film support. 2 solid and 4 ghost steps were obtained upon processing the film according to the method of Control A.

EXAMPLE 10

| Control B coating solution | 99.5 grams |
| 2,4-resorcyclic acid ethanol amide | 0.5 gram |

2,4-resorcyclic acid ethanol amide was added to the Control B coating solution. The dissolution of 2,4-resorcyclic acid ethanol amide was performed by agitation of the solution for 20 minutes at room temperature. A polyester film support was whirl coated with the filtered solution and upon processing, according to the method of Control A, gave 1 solid and 4 ghost steps.

EXAMPLE 11

| Control B coating solution | 99.5 grams |
| 4-bromo,3,5-resorcyclic acid amide | 0.5 gram |

4-bromo,3,5-resorcyclic acid amide was dissolved in the solution by agitation for 20 minutes. The filtered solution was whirl coated onto a polyester film support. The coated film upon processing gave 1 solid and 4 ghost steps.

EXAMPLE 12

| Control B coating solution | 99.3 grams |
| aceto acetbenzyl amide | 0.7 gram |

The solution was made by agitating aceto acetbenzyl amide and Control B coating solution for 20 minutes at room temperature. The filtered solution was whirl coated onto a polyester film support. The coated film upon processing, according to the procedure of Control A, gave 2 solid and 3 ghost steps.

The enhancement in speed over the controls exhibited by the utilization of chemical compounds containing sulfur or amide groups in the contact film formulation is given in Table 1.

TABLE 1

| Control + Accelerators | Solid Steps | Ghost Steps |
|---|---|---|
| Control A + | 0 | 1 |
| 1,1-thiobis (2-naphthol) | 1 | 2 |
| diresorcinol sulfide | 1 | 1 |
| 2-mercaptobenzothiazole | 0 | 3 |
| diphenyl sulfone | 0 | 2 |
| phenothiazine | 0 | 3 |
| dibenzothiophene sulfone | 0 | 2 |
| 2-benzoxazolethiol | 0 | 2 |
| 3,5-resorcyclic acid ethanol amide | 0 | 2 |
| 2,4-resorcyclic acid ethanol amide | 0 | 2 |
| 4-bromo,3,5-resorcyclic acid amide | 1 | 1 |
| aceto acetbenzyl amide | 1 | 1 |
| Control B + | 1 | 2 |
| 1,1-thiobis (2-naphthol) | 2 | 3 |

TABLE 1-continued

| Control + Accelerators | Solid Steps | Ghost Steps |
| --- | --- | --- |
| diresorcinol sulfide | 1 | 4 |
| 2-mercaptobenzothiazole | 1 | 4 |
| diphenyl sulfone | 1 | 3 |
| phenothiazine | 1 | 4 |
| dibenzothiophene sulfone | 1 | 3 |
| 2-benzoxazolethiol | 1 | 3 |
| 3,5-resorcyclic acid ethanol amide | 1 | 4 |
| 2,4-resorcyclic acid ethanol amide | 1 | 4 |
| 4-bromo,3,5-resorcyclic acid amide | 2 | 2 |
| aceto acetbenzyl amide | 2 | 3 |
| Control C + | 2 | 2 |
| 1,1-thiobis (2-naphthol) | 2 | 5 |
| diresorcinol sulfide | 2 | 4 |
| 2-mercaptobenzothiazole | 2 | 4 |
| diphenyl sulfone | 2 | 3 |
| phenothiazine | 2 | 4 |
| dibenzothiophene sulfone | 2 | 3 |
| 2-benzoxazolethiol | 2 | 3 |
| 3,5-resorcyclic acid ethanol amide | 2 | 4 |
| 2,4-resorcyclic acid ethanol amide | 2 | 4 |
| 4-bromo,3,5-resorcyclic acid amide | 2 | 4 |
| aceto acetbenzyl amide | 2 | 4 |

As can be seen from an analysis of Table 1, the chemical compounds containing sulfur or amide groups of examples 1-12 impart at least 40% increase and in some cases upto 300% increase in the speed of contact film when compared with the controls.

The processed films of Examples 1 to 12 were found to have 10 to 20% improved resolution and transmission density in comparison to the Controls A, B and C.

The non-processed whirl coated films of Examples 1 to 12 were baked at 100° C. up to half an hour along with the unprocessed control films A, B and C. The baked films of Examples 1 to 12 and baked Control films A, B and C were exposed and developed in the same manner as described in the Control A. No detrimental effect on the shelf-life, ease of developability, resolution and transmission density of the coated films of Examples 1 to 12 was observed in comparison to the Controls A, B and C.

Wipe-on and presensitized printing plates, wherein, not only is the diazonuim compound ionically bonded to Aluminum/Aluminum oxide hydrophilized surface, but also gets mechanically anchored to the surface, differ from the contact exposure films and proofing films. In the case of contact exposure or proofing films, the diazonium compound is held by adhesive forces on the surface of a polyester substrate. The diazonium ionic bonds help provide the desired longer press run, while in the case of contact or proofing films, the diazonium compound helps in the graded differentiation of image and non-image areas after development.

What I claim is:

1. A composition comprising a light sensitive diazonium compound and an accelerator selected from the group consisting of 1,1-thiobis(2-naphthol), diresorcinol sulfide, diphenyl sulfone, phenothiazine, dibenzothiophene sulfone, N-(3-hydroxyphenyl)-2-hydroxy-3-naphthamide, 2,3-dihydroxy naphthoic acid ethanolamide, N,N'-ethylene-bis-acetoacetamide, 4-bromo-3,5-resorcyclic acid ethanolamide, 3,5-resorcyclic acid ethanolamide 2,4-resorcyclic acid ethanol amide, acetoacetbenzylamide, 2-mercaptobenzothiazole, and 2-benzoxazolethiol, wherein said diazonium compound is selected from the group consisting of the condensation products of Formula I, Formula II and Formula IV as set forth herein such that said accelerator is present in said composition in an amount from about 0.005 to about 1.5 parts by weight of accelerator per part by weight of said diazonium compound.

2. The composition of claim 1 wherein said accelerator is selected from the group consisting of 1,1-thiobis(2-naphthol), diresorcinol sulfide, phenothiazine, dibenzothiophene sulfone, N-(3-hydroxyphenyl)-2-hydroxy-3-naphthamide, 2,3-dihydroxy naphthoic acid ethanolamide, N,N'-ethylene-bis-acetoacetamide, 4-bromo-3,5-resorcyclic acid amide, 3,5-resorcyclic acid ethanolamide, 2,4-resorcyclic acid ethanolamide, acetoacetbenzylamide, 2-mercaptobenzothiazole, and 2-benzoxathiazolethiol.

3. A light sensitive reproduction material comprising a support and a reproduction layer thereon having the composition of claim 1.

4. The reproduction material of claim 3 wherein said support is selected from the group of supports which are comprised of aluminum, polyester, polystyrene, polyamide, polycarbonate, polypropylene, cellulose acetate films, glass, metal coated material and the like.

5. The reproduction material of claim 4 wherein said reproduction layer contains the accelerator which is present at a level of about 0.005 to about 1.5 by weight per part by weight of diazonium compound.

6. The composition of claim 1 wherein said accelerator is phenothiazine.

7. The composition of claim 1 wherein said accelerator is 1,1-thiobis(2-naphthol).

8. The composition of claim 1 wherein said accelerator is 2-mercaptobenzothiazol.

9. The composition of claim 1 wherein said accelerator is 3,5 resorcylic acid ethanol amide.

10. The composition of claim 1 wherein said diazonium compound is the condensation product of Formula I as set forth herein.

11. The composition of claim 1 wherein said diazonium compound is the condensation product of Formula II as set forth herein.

12. The composition of claim 1 wherein said diazonium compound is the condensation product of Formula IV as set forth herein.

13. The composition of claim 6 wherein said diazonium compound is the condensation product of Formula IV as set forth herein.

14. The composition of claim 7 wherein said diazonium compound is the condensation product of Formula IV as set forth herein.

15. The composition of claim 8 wherein said diazonium compound is the condensation product of Formula IV as set forth herein.

16. The composition of claim 9 wherein said diazonium compound is the condensation product of Formula IV as set forth herein.

* * * * *